(12) United States Patent
Takeshita et al.

(10) Patent No.: US 8,659,105 B2
(45) Date of Patent: Feb. 25, 2014

(54) WIRING SUBSTRATE, IMAGING DEVICE AND IMAGING DEVICE MODULE

(75) Inventors: Fumiaki Takeshita, Satsumasendai (JP); Yousuke Moriyama, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 42 days.

(21) Appl. No.: 13/262,598

(22) PCT Filed: Nov. 26, 2010

(86) PCT No.: PCT/JP2010/071136
§ 371 (c)(1),
(2), (4) Date: Nov. 30, 2011

(87) PCT Pub. No.: WO2011/065485
PCT Pub. Date: Jun. 3, 2011

(65) Prior Publication Data
US 2012/0104524 A1 May 3, 2012

(30) Foreign Application Priority Data
Nov. 26, 2009 (JP) ................................. 2009-268222

(51) Int. Cl.
*H01L 31/0232* (2006.01)
(52) U.S. Cl.
USPC ........................................................ 257/432
(58) Field of Classification Search
USPC ................................................... 257/432
See application file for complete search history.

(56) References Cited

U.S. PATENT DOCUMENTS

| 2003/0034127 A1 | 2/2003 | Segawa |
| 2004/0211986 A1 | 10/2004 | Minamio et al. |
| 2005/0270403 A1 | 12/2005 | Adachi et al. |
| 2006/0083459 A1 | 4/2006 | Minamio et al. |

(Continued)

FOREIGN PATENT DOCUMENTS

| EP | 1699082 A1 | 9/2006 |
| JP | 56144561 A * | 11/1981 |

(Continued)

OTHER PUBLICATIONS

International search report dated Dec. 28, 2010 for corresponding PCT application PCT/JP2010/071136 cites the foreign patent documents above.

(Continued)

*Primary Examiner* — Anthony Ho
(74) *Attorney, Agent, or Firm* — DLA Piper LLP (US)

(57) ABSTRACT

A imaging device includes a first insulating substrate having a through hole, a connection electrode and a first wiring conductor, a second insulating substrate having outside terminals and a second wiring conductor, and an imaging element including a light-receiving portion arranged at a center portion on an upper surface thereof and a connection terminal arranged at an outer peripheral portion thereof, at least one of the lower surface of the first insulating substrate and the upper surface of the second insulating substrate including a recess portion, the through hole being located on an inner side thereof, the imaging element being arranged below the first insulating substrate such that the light-receiving portion is located within the through hole, the connection terminal being electrically connected to the connection electrode, the imaging element being accommodated inside the recess portion, outer peripheral portions of the first insulating substrate and the second insulating substrate being electrically connected to each other.

9 Claims, 9 Drawing Sheets (56) References Cited

U.S. PATENT DOCUMENTS

2006/0110097 A1    5/2006  Gobara et al.
2007/0252227 A1   11/2007  Fukuda et al.
2008/0136012 A1    6/2008  Yang et al.
2008/0206918 A1*   8/2008  Yang et al. ................ 438/65
2009/0284942 A1*  11/2009  Yui et al. ................. 361/783

FOREIGN PATENT DOCUMENTS

| JP | 05183135 A   | 7/1993 |   |
| --- | --- | --- | --- |
| JP | 11103039 A   | 4/1999 |   |
| JP | 2001245186 A | 9/2001 |   |
| JP | 2002204067 A | 7/2002 |   |
| JP | 2004327916 A | 11/2004 |   |
| JP | 2006114770 A | 4/2006 |   |
| JP | 2006147916 A | 6/2006 |   |
| JP | 2006201427 A | * | 8/2006 |
| JP | 2006245359 A | 9/2006 |   |
| JP | 2006333131 A | 12/2006 |   |
| JP | 2008205429 A | 9/2008 |   |

OTHER PUBLICATIONS

Japanese language office action dated Nov. 6, 2012 and its English language translation issued in corresponding Japanese application 2011543323.

Extended European search report dated Oct. 9, 2013 issued in corresponding European application 10833331.1 cites the U.S. patent application publication and foreign patent documents listed above.

* cited by examiner

WIRING SUBSTRATE, IMAGING DEVICE AND IMAGING DEVICE MODULE

CROSS-REFERENCE TO THE RELATED APPLICATIONS

The present application is a national stage of international application No. PCT/JP2010/071136, filed on Nov. 26, 2010, and claims the benefit of priority under 35 USC 119 to Japanese Patent Application No. 2009-268222, filed Nov. 26, 2009, the entire contents of which are incorporated herein by reference.

TECHNICAL FIELD

The present invention relates to a wiring substrate for mounting a CCD (Charge Coupled Device) type or CMOS (Complementary Metal Oxide Semiconductor) type imaging element thereon, an imaging device using the imaging element, as well as an imaging device module using this imaging device.

BACKGROUND ART

Imaging devices are conventionally known that are suitable for digital cameras or optical sensors or the like, in which a CCD-type or CMOS-type imaging element is mounted on a wiring substrate. For example, an imaging device is known that includes a wiring substrate having a through hole formed in a center portion thereof, a recess portion being formed in a lower surface thereof such that the through hole is located on an inner side of the recess portion, a connection terminal being arranged around the through hole on the lower surface and outside terminals arranged at an outer peripheral portion thereof, the wiring substrate being provided with a wiring conductor one end of which is connected to the connection electrode and the other end of which is connected to the outside terminals, and an imaging element which is flip-chip mounted such that a light-receiving portion is located within the through hole at the bottom surface of the recess portion of the wiring substrate (see Patent Literature 1, for example). With such an imaging device, light (images) entering the light-receiving portion of the imaging element through the through hole is converted by the imaging element into an electrical signal, and is outputted via the wiring conductor of the wiring board and outside terminals to an external circuit or the like within a digital camera.

Such an imaging device including a flip-chip type imaging element needs less space for connections to the periphery of the imaging element with bonding wires than an imaging device in which the imaging element placed on the wiring substrate is connected to conductors by bonding wires (see, for example, Patent Literature 2 or Patent Literature 3), so that the imaging device can be made more compact.

Moreover, this imaging device can be turned into an imaging device module by protecting the light-receiving portion of the imaging device with a light-transmitting plate member, made of glass or the like, that is attached to the upper surface of the wiring substrate, covering the through hole, and arranging a lens over the imaging element with a lens-fixing member.

CITATION LIST

Patent Literature

Patent Literature 1: Japanese Unexamined Patent Publication JP-A 2006-201427

Patent Literature 2: Japanese Unexamined Patent Publication JP-A 11-103039 (1999)

Patent Literature 3: Japanese Unexamined Patent Publication JP-A 5-183135 (1993)

SUMMARY OF INVENTION

Technical Problem

However, in imaging devices used in electronic devices such as mobile phones or digital cameras for which an emphasis is placed on mobility, there is a demand for ever greater compactness. On the other hand, in conventional imaging devices as described above, a width of the lateral wall portions of the recess portion is made smaller in order to make the wiring substrate more compact, but as the width of the lateral wall portions becomes smaller, the surface area of the lower surface of the lateral wall portions becomes smaller, and there is the problem that strength of a joint portion between the outside terminals and the external circuit board is lowered.

The reason for this is that, since the width of the lateral wall portions is small and the surface area of the joint portion between the outside terminals and the external circuit board is small, when heat is applied to an external circuit board and lateral wall portions having different thermal expansion coefficients, the joint portion may break due to the thermal stress occurring between the external circuit board and the lateral wall portions caused by the difference in thermal expansion of the external circuit board and the lateral wall portions, and the outside terminals may peel off from the external circuit board.

The invention has been conceived in view of the above-noted problems in the prior art, and it is an object thereof to provide a wiring substrate, an imaging device as well as an imaging device module that can be made compact and with which the reliability of the joint to the external circuit board can be improved.

Solution to Problem

A wiring substrate of the invention includes a first insulating substrate having a through hole formed in a center portion thereof, a connection electrode to which a connection terminal of an imaging element is connected, being arranged around the through hole on a lower surface of the first insulating substrate, and a first wiring conductors comprising one end connected to the connection electrode and the other end led out to an outer peripheral portion on the lower surface of the first insulating substrate; and a second insulating substrate, a plurality of outside terminals arranged on an entire surface on a lower surface of the second insulating substrate, and a second wiring conductors include one end connected to the outside terminals and the other end of which is led out to an outer peripheral portion on an upper surface of the second insulating substrate, wherein at least one of the lower surface of the first insulating substrate and the upper surface of the second insulating substrate the through hole being located on an inner side of the recess portion in a plan view, and an outer peripheral portion of the first insulating substrate being joined to an outer peripheral portion of the second insulating substrate so that the first wiring conductors and the second wiring conductors are electrically connected to each other.

An imaging device of the invention includes a first insulating substrate having a through hole formed in a center portion thereof, a connection electrode being arranged around the through hole on a lower surface of the first insulating substrate, and a first wiring conductors comprising one end connected to the connection electrode and the other end led out to an outer peripheral portion on the lower surface of the first insulating substrate; a second insulating substrate, a plurality of outside terminals arranged on an entire surface on a lower surface of the second insulating substrate, and a second wiring conductors including one end of which is connected to the outside terminals and the other end of which is led out to an outer peripheral portion on an upper surface of the second insulating substrate; and an imaging element including a light-receiving portion arranged at a center portion on an upper surface thereof, and a connection terminal arranged at an outer peripheral portion thereof, wherein at least one of the lower surface of the first insulating substrate and the upper surface of the second insulating substrate comprises a recess portion, the through hole being located on an inner side thereof, the imaging element is arranged below the first insulating substrate such that the light-receiving portion on the upper surface of the imaging element is located within the through hole in a plan view, the connection terminal being electrically connected to the connection electrode, and an outer peripheral portion of the first insulating substrate being joined to an outer peripheral portion of the second insulating substrate so that the first wiring conductor and the second wiring conductor are electrically connected to each other and the imaging element is accommodated inside the recess portion.

Moreover, in the imaging device of the invention, it is preferable that the first insulating substrate and the second insulating substrate are made of materials with a same thermal expansion coefficient.

Moreover, in the imaging device of the invention, it is preferable that a joint portion where the outer peripheral portion of the first insulating substrate is joined to the outer peripheral portion of the second insulating substrate is arranged on the second insulating substrate side in thickness direction of the imaging element with respect to the light-receiving portion.

Moreover, in the imaging device of the invention, it is preferable that a joint portion where the outer peripheral portion of the first insulating substrate is joined to the outer peripheral portion of the second insulating substrate is joined together by engaging together a depression and a protrusion that are formed at the outer peripheral portion of the first insulating substrate and the outer peripheral portion of the second insulating substrate.

Moreover, in the imaging device of the invention, it is preferable that a joint portion where the outer peripheral portion of the first insulating substrate is joined to the outer peripheral portion of the second insulating substrate is inclined from an outer periphery side of the first insulating substrate and an outer periphery side of the second insulating substrate toward a center of the second insulating substrate to the second insulating substrate side.

Moreover, in the imaging device of the invention, it is preferable that a size of the first insulating substrate and a size of the second insulating substrate are different in a plan view, and the first insulating substrate and the second insulating substrate are joined together with a joining member the joining member being arranged at an outer peripheral portion of the larger insulating substrate and an outer peripheral portion and a lateral surface of the smaller insulating substrate.

Moreover, in the imaging device of the invention, it is preferable that a light-transmitting plate member is attached to the upper surface of the first insulating substrate and covers the through hole.

Moreover, in the imaging device of the invention, it is preferable that a space enclosed by the imaging element, the light-transmitting plate member and the first insulating substrate is sealed.

Moreover, an imaging device module of the invention includes the imaging device mentioned above, and a lens arranged over the through hole on the upper surface of the first insulating substrate.

Advantageous Effects of Invention

In the wiring substrate of the invention, a recess portion is formed in at least one of the lower surface of the first insulating substrate and the upper surface of the second insulating substrate comprises a recess portion, the through hole being located on an inner side of the recess portion in a plan view, and an outer peripheral portion of the first insulating substrate is joined to an outer peripheral portion of the second insulating substrate, the first wiring conductor and the second wiring conductor are electrically being connected to each other, so that compared to a wiring substrate used in a conventional imaging device as described above, the outside terminals can be formed with a large surface area, the surface area of the joint portion between the outside terminals and the wiring conductors of the external circuit board can be made large, so that when joining to the external circuit board, the strength of the joint between the external circuit board and the wiring substrate can be increased.

In an imaging device of the invention, at least one of the lower surface of the first insulating substrate and the upper surface of the second insulating substrate comprises a recess portion, the through hole being located on an inner side of the recess portion, the imaging element is arranged below the first insulating substrate such that when seen in a plan view, the light-receiving portion on the upper surface of the imaging element is located within the through hole in a plan view, the connection elements are electrically connected to the connection electrodes, and an outer peripheral portion of the first insulating substrate is joined to an outer peripheral portion of the second insulating substrate, electrically connecting the first wiring conductors and the second wiring conductors to each other, and the imaging element is accommodated inside the recess portion, so that even when the width of the lateral wall portions of the first insulating substrate is made smaller in order to make the device compact, the plurality of outside terminals are arranged on the lower surface of the second insulating substrate, so that compared to a conventional imaging device as described above, the outside terminals can be formed with a larger surface area, and the surface area of the joint portion between the outside terminals and the wiring conductors of the external circuit board can be made large. Consequently, even when thermal stress occurs due to a difference in the thermal expansion of the external circuit board and the lateral wall portions at the joint portion between the outside terminals and the wiring conductors of the external circuit board when the ambient temperature changes due to changes in the usage environment, peeling off of the outside terminals from the external circuit board can be suppressed and an imaging device that is small and has a high-strength joint to the external circuit board can be realized.

Moreover, by connecting the outside terminals and the external circuit board with a large surface area, thermal stress is suppressed that is applied to the outer peripheral portion of the first insulating substrate due to a difference in the thermal expansion coefficients of the external circuit board and the second insulating substrate when the ambient temperature changes due to changes in the usage environment, so that it is possible to realize an imaging device in which flexing of the imaging element mounted to the first insulating substrate due to stress is suppressed and external light can be favorably received.

Moreover, with an imaging device of the invention, in the above-described configuration, when the first insulating substrate and the second insulating substrate are made of materials with the same thermal expansion coefficient, it is possible to suppress that thermal stress due to a difference in thermal expansion is applied to the joint portion between the first wiring substrate and the second wiring substrate, even when the ambient temperature changes due to changes in the usage environment, so that ruptures at the joint portion between the first wiring conductor and the second wiring conductor can be reduced.

Moreover, with an imaging device of the invention, in the above-described configuration, a joint portion where the outer peripheral portion of the first insulating substrate is joined to the outer peripheral portion of the second insulating substrate is arranged to the second insulating substrate side in thickness direction of the imaging element with respect to the light-receiving portion. Accordingly, even when light enters the recess portion from the joint portion, the light intrudes below the light-receiving portion, so that unnecessary light reaching the light-receiving portion can be reduced.

Moreover, with an imaging device of the invention, in the above-described configuration, a joint portion where the outer peripheral portion of the first insulating substrate is joined to the outer peripheral portion of the second insulating substrate is joined together by engaging together a depression and a protrusion that are formed at the outer peripheral portion of the first insulating substrate and the outer peripheral portion of the second insulating substrate, so that with the depression and the protrusion engaging together, it is possible to prevent light from the joint portion from intruding into the recess portion, so that unnecessary light reaching the light-receiving portion can be reduced.

Moreover, with an imaging device of the invention, in the above-described configuration, a joint portion where the outer peripheral portion of the first insulating substrate is joined to the outer peripheral portion of the second insulating substrate is inclined from an outer periphery side of the first insulating substrate and an outer periphery side of the second insulating substrate toward the center of the second insulating substrate to the second insulating substrate side. Accordingly, even when light enters the recess portion from the joint portion, the light propagates toward the second insulating substrate side below the light-receiving portion, so that unnecessary light reaching the light-receiving portion can be reduced.

Moreover, with an imaging device of the invention, in the above-described configuration, a size of the first insulating substrate and a size of the second insulating substrate are different in a plan view, and the first insulating substrate and the second insulating substrate are joined together with a joining member, the joining member being arranged at an outer peripheral portion of the larger insulating substrate and an outer peripheral portion and a lateral surface of the smaller insulating substrate. Accordingly, in addition to the outer peripheral portion, the lateral surface of the smaller insulating substrate and the outer peripheral portion of the larger insulating substrate are joined together, so that the strength of the joint between the first insulating substrate and the second insulating substrate can be increased.

Moreover, with an imaging device of the invention, in the above-described configuration, when a light-transmitting plate member is attached to the upper surface of the first insulating substrate and covers the through hole, moisture and dust will not enter the through hole and attach to the light-receiving portion of the imaging element. Accordingly, it is possible to protect the imaging element and it is possible to output an image signal with high image quality without compromising the light reception.

Moreover, with an imaging device of the invention, when in the above-described configuration, a space enclosed by the imaging element, the light-transmitting plate member and the first insulating substrate is sealed, so that moisture and dust can be kept from intruding into the sealed space, and corrosion of the imaging element due to high humidity can be suppressed.

Moreover, in an imaging device module of the invention, a lens is arranged over the through hole on the upper surface of the first insulating substrate, so that an imaging device module is attained that is compact and with which an image signal of high image quality can be outputted.

DESCRIPTION OF EMBODIMENTS

The following is an explanation of an imaging device and an imaging device module of the invention, with reference to the accompanying drawings. In FIGS. 1 to 9, reference numeral 1 denotes a wiring substrate, reference numeral 1a denotes a first insulating substrate, reference numeral 1b denotes a second insulating substrate, reference numeral 1c denotes a depression, reference numeral 1d denotes a protrusion, reference numeral 2 denotes a through hole, reference numeral 3 denotes a wiring conductor, reference numeral 3a denotes a first wiring conductor, reference numeral 3b denotes a second wiring conductor, reference numeral 4 denotes a connection electrode, reference numeral 5 denotes an outside terminal, reference numeral 6 denotes an imaging element, reference numeral 6a denotes a light-receiving portion, reference numeral 6b denotes a connection terminal, reference numeral 7 denotes a recess portion, reference numeral 7a denotes a first recess portion, reference numeral 7b denotes a second recess portion, reference numeral 8 denotes a joint member, reference numeral 9 denotes a light-transmitting plate member, reference numeral 10 denotes a lens, reference numeral 11 denotes a lens-fixing member, reference numeral 12 denotes a electronic component, and reference numeral 13 denotes a projection portion.

As in examples shown in FIGS. 1, 2 and 5 to 9, the imaging device of the invention includes a first insulating substrate 1a having a through hole 2 formed in a center portion thereof, a connecting electrode 4 being arranged around the through hole 2 on a lower surface of the first insulating substrate 1a, and a first wiring conductors 3a comprising one end connected to the connection electrode 4 and the other end led out to an outer peripheral portion on the lower surface of the first insulating substrate 1a, a second insulating substrate 1b including a plurality of outside terminals 5 arranged on a lower surface of the second insulating substrate 1b, and a second wiring conductors 3b comprising one end connected to the outside terminals 5 and the other end led out to an outer peripheral portion on an upper surface of the second insulating substrate 1b, wherein and an imaging element 6 including a light-receiving portion 6a arranged at a center portion on an upper surface thereof, and a connecting terminals arranged in an outer peripheral portion thereof, wherein at least one of the lower surface of the first insulating substrate 1a and the upper surface of the second insulating substrate 1b comprises a recess portion, the through hole 2 being located on an inner side of the recess portion 7, the imaging element 6 is arranged below the first insulating substrate 1a such that the light-receiving portion 6a on the upper surface of the imaging element 6 is located within the through hole 2 in a plan view, the connection terminal 6b being electrically connected to the connection electrode 4, and an outer peripheral portion of the first insulating substrate 1a are joined to an outer peripheral portion of the second insulating substrate 1b so that the first wiring conductors 3a and the second wiring conductors 3b are electrically connected to each other and the imaging element 6 is accommodated inside the recess portion 7. It should be noted that the wiring substrate 1 is arranged such that the outer peripheral portion of the first insulating substrate 1a and the outer peripheral portion of the second insulating substrate 1b are joined together.

According to such an imaging device of the invention, even when a width of lateral wall portions of the first insulating substrate 1a is made smaller in order to make the imaging device more compact, the plurality of outside terminals 5 are arranged on the lower surface of the second insulating substrate 1b, so that compared to a conventional imaging device that includes a wiring substrate and an imaging element, where the wiring substrate is provided with a through hole in its center portion, where a recess portion is formed in its lower surface such that the through hole is located on an inner side of the recess, connection terminals are arranged around the through hole on the lower surface and outside terminals are arranged in an outer peripheral portion, the wiring substrate including wiring conductors having one end connected to the connection electrodes and the other end connected to the outside terminals, and the imaging element being flip-chip mounted such that its light-receiving portion is located inside the through hole in the bottom surface of the recess portion of the wiring substrate, the outside terminals 5 can be provided with a larger surface area, and the surface area of a joint portion between the outside terminals 5 and the wiring conductors of the external circuit board can be made larger. Consequently, even when thermal stress occurs due to a difference in the thermal expansion of the external circuit board and the lateral wall portions at the joint portion between the outside terminals 5 and the external circuit board when the ambient temperature changes due to changes in the usage environment, peeling off of the outside terminals 5 from the external circuit board can be suppressed and an imaging device that is small and has a high-strength joint to the external circuit board can be realized.

Figure 1:
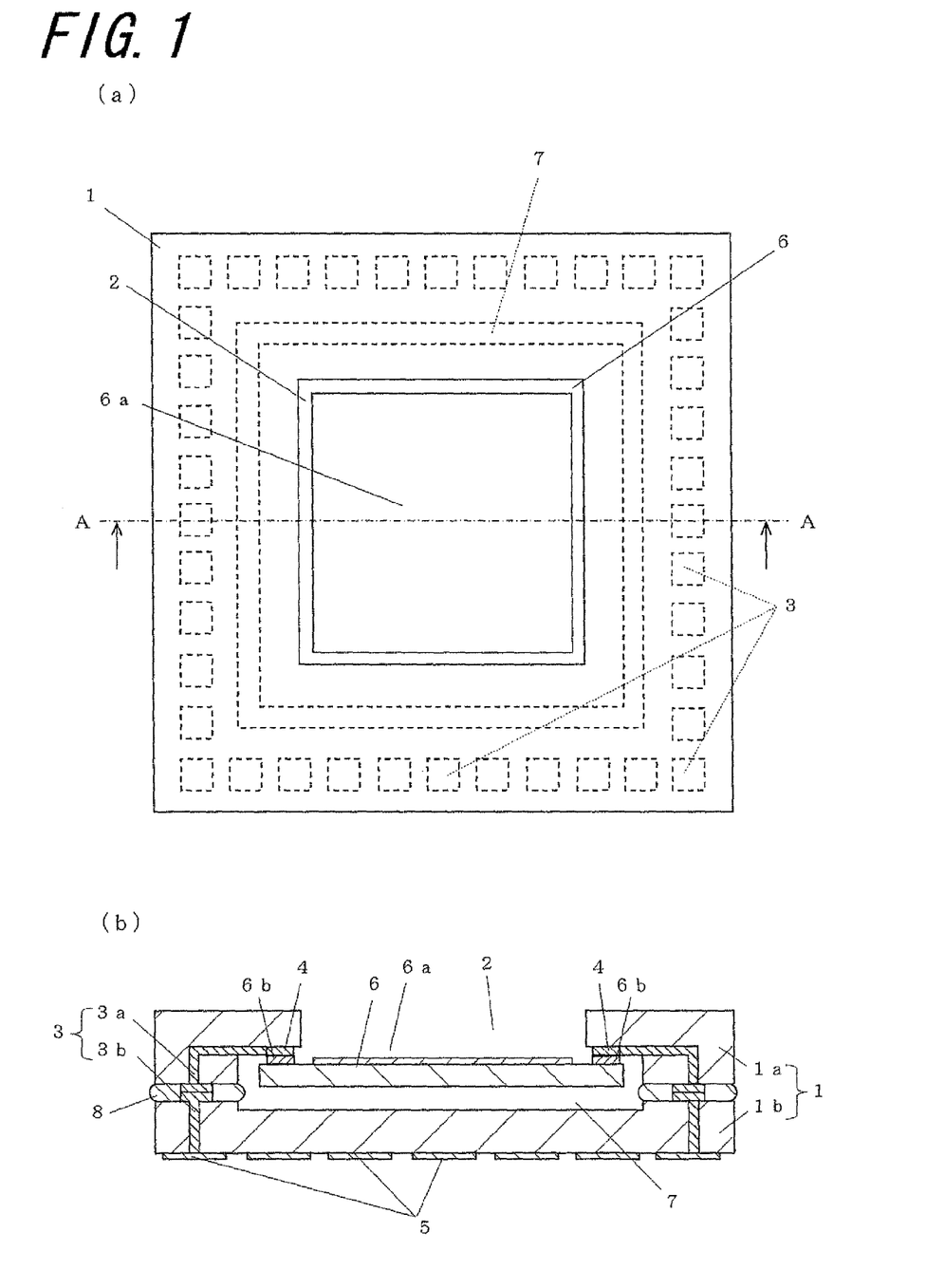
FIG. 1(a) is a top view showing an example of an embodiment of an imaging device of the invention.
FIG. 1(b) is a cross-sectional view of FIG. 1(a) along the line A-A.
Figure 2:
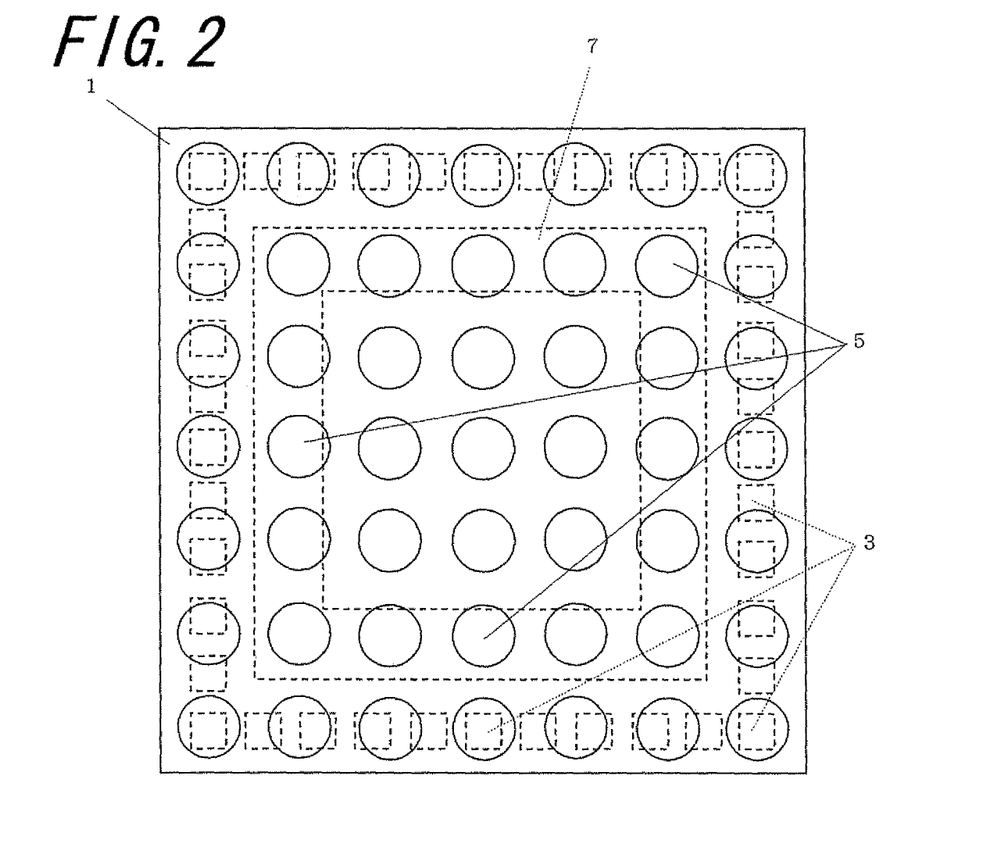
FIG. 2 is a bottom view showing an example of an embodiment of the imaging device of the invention.
Figure 3:
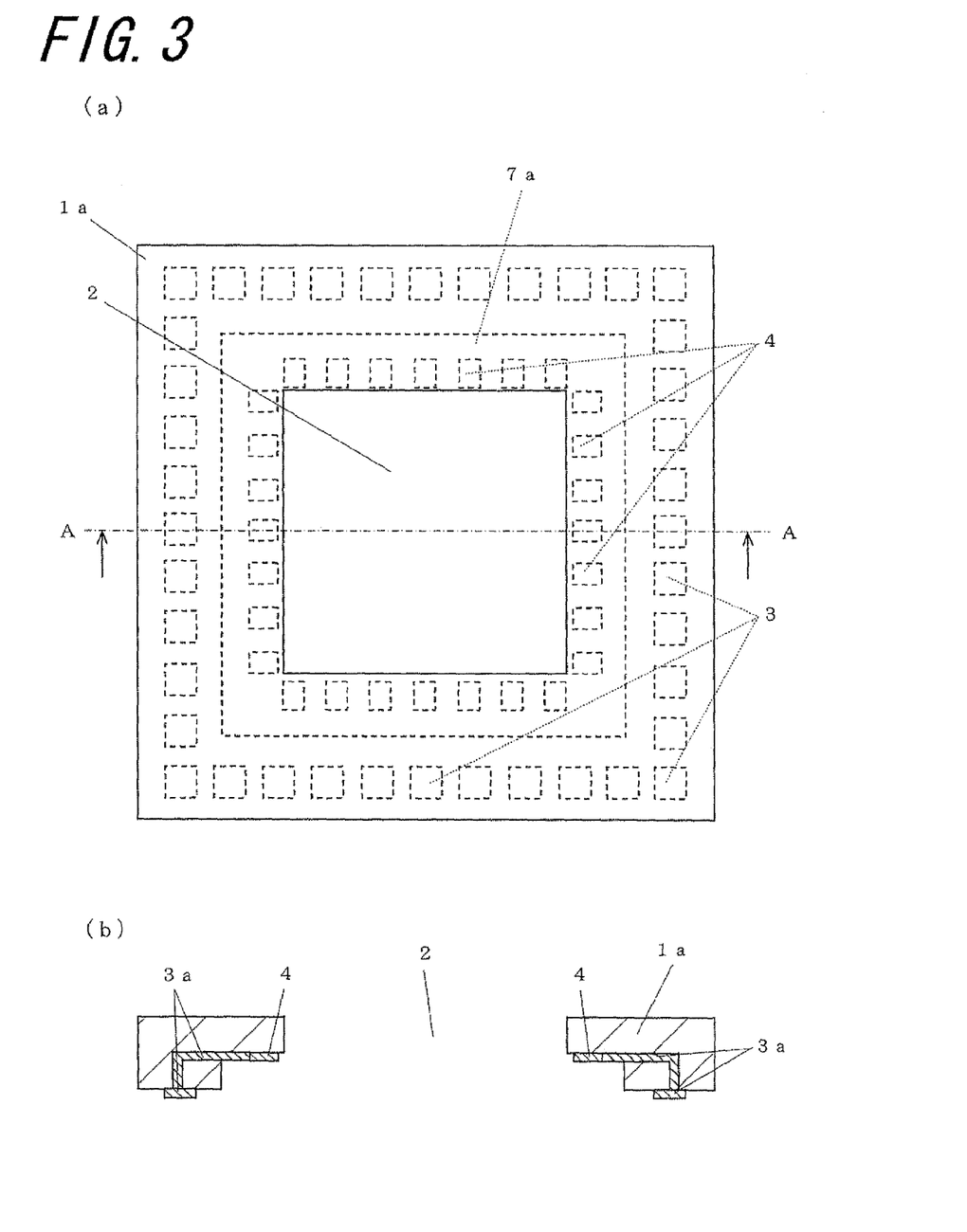
FIG. 3(a) is a top view showing an example of an embodiment of a first insulating substrate in the imaging device of the invention.
FIG. 3(b) is a cross-sectional view of FIG. 3(a) along the line A-A.
Figure 4:
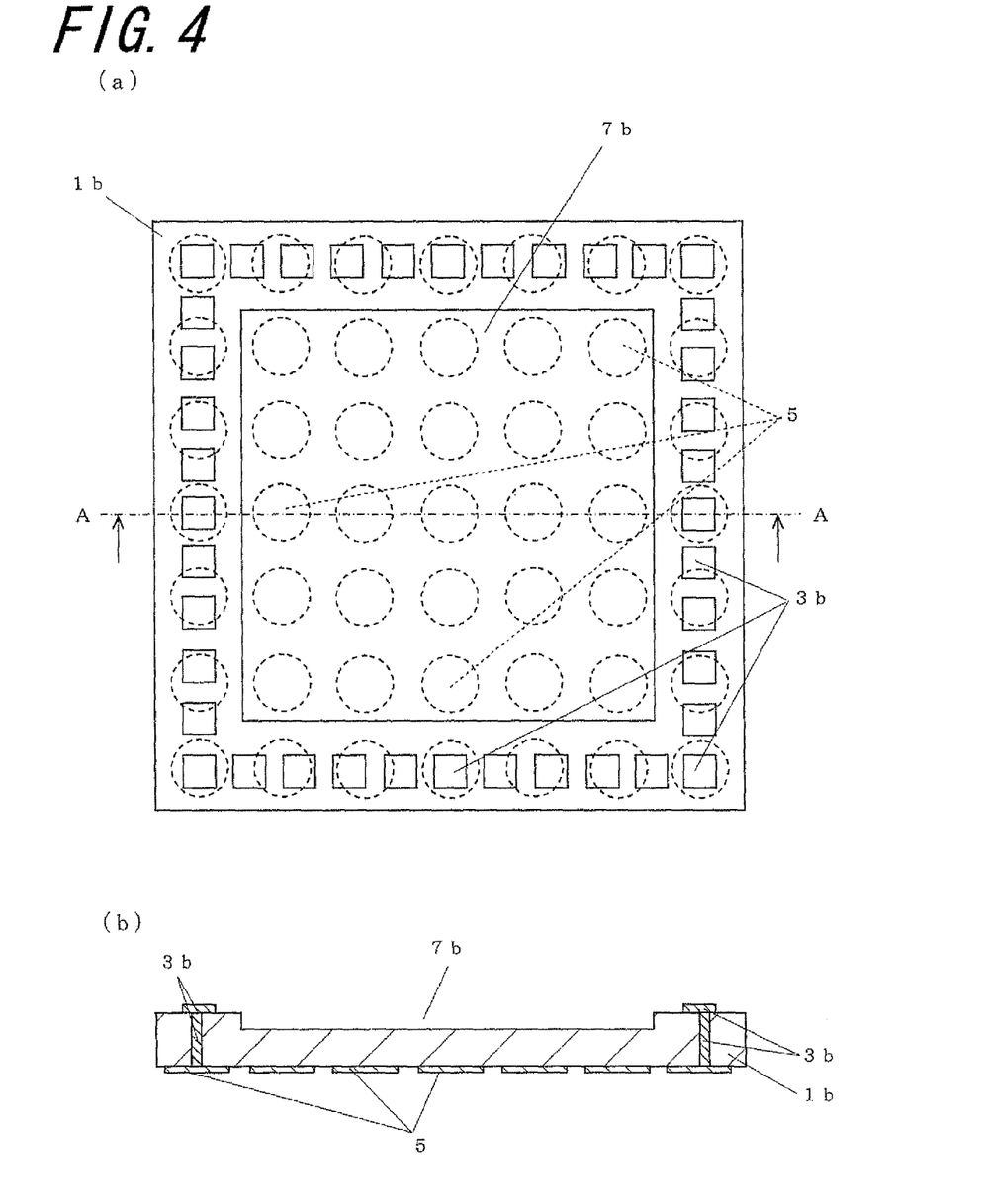
FIG. 4(a) is a top view showing an example of an embodiment of a second insulating substrate in the imaging device of the invention.
FIG. 4(b) is a cross-sectional view of FIG. 4(a) along the line A-A.
Figure 5:
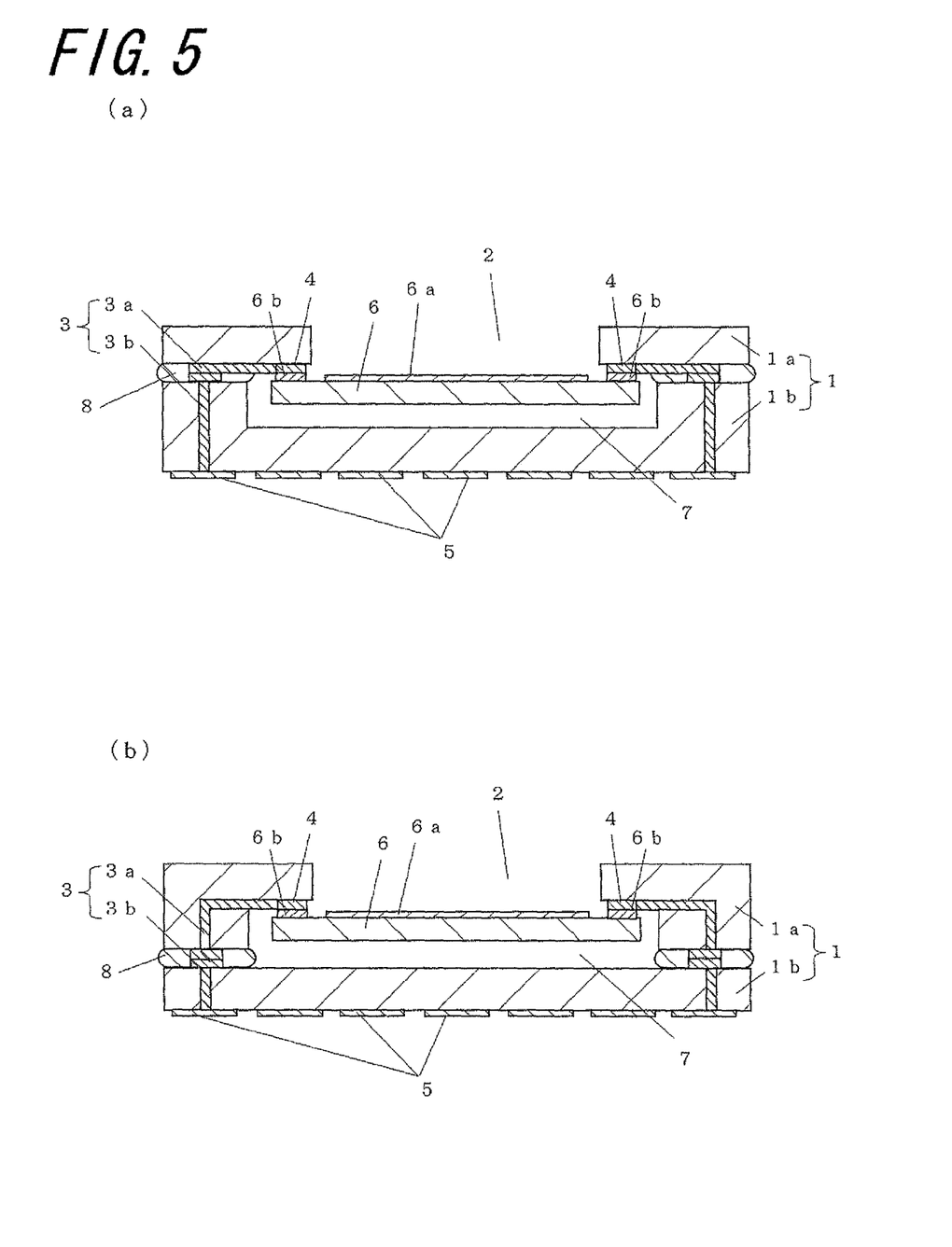
FIG. 5(a) and FIG. 5(b) are cross-sectional views showing other examples of embodiments of the imaging device of the invention.
Figure 6:
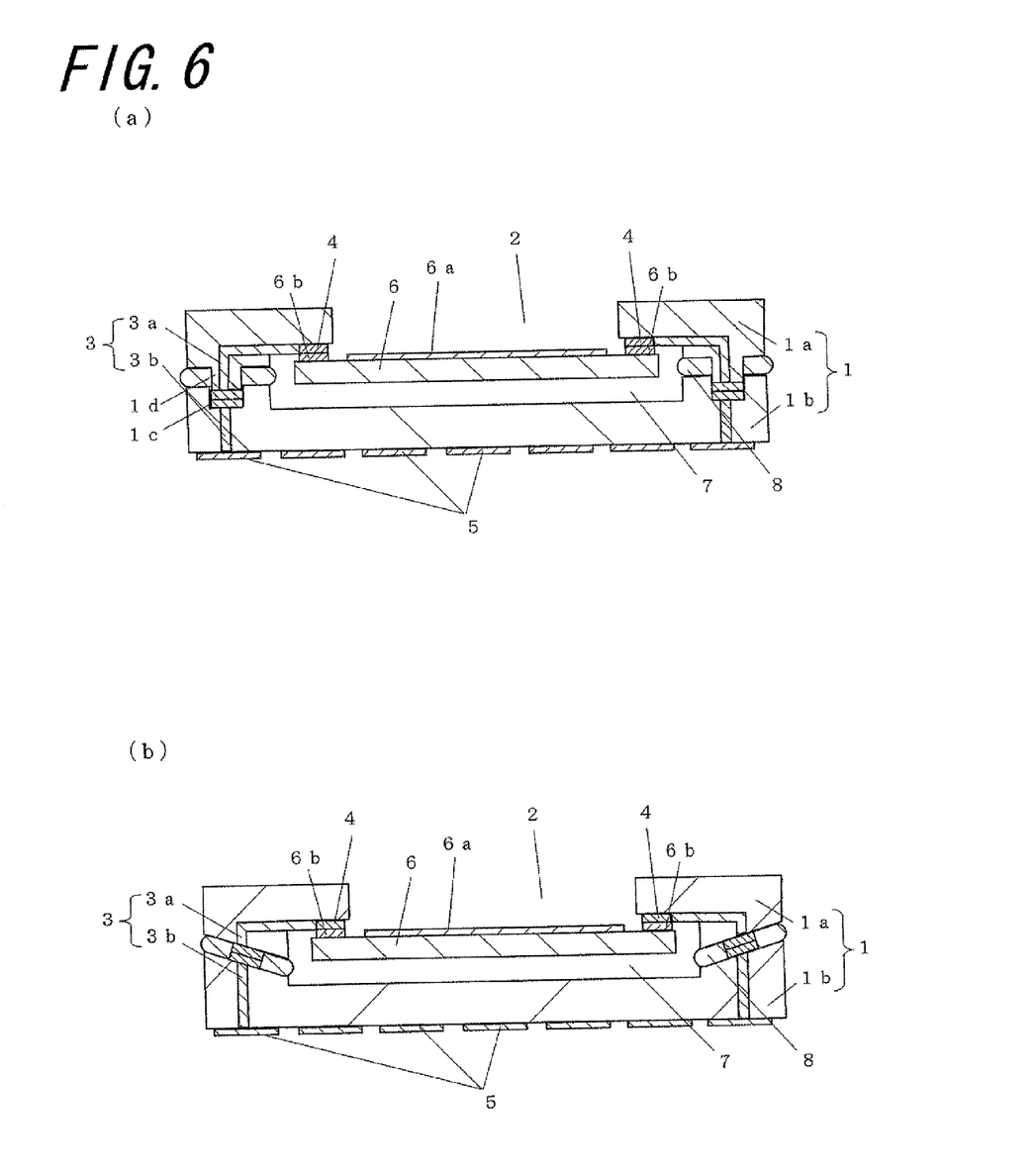
FIG. 6(a) and FIG. 6(b) are cross-sectional views showing other examples of embodiments of the imaging device of the invention.
Figure 7:
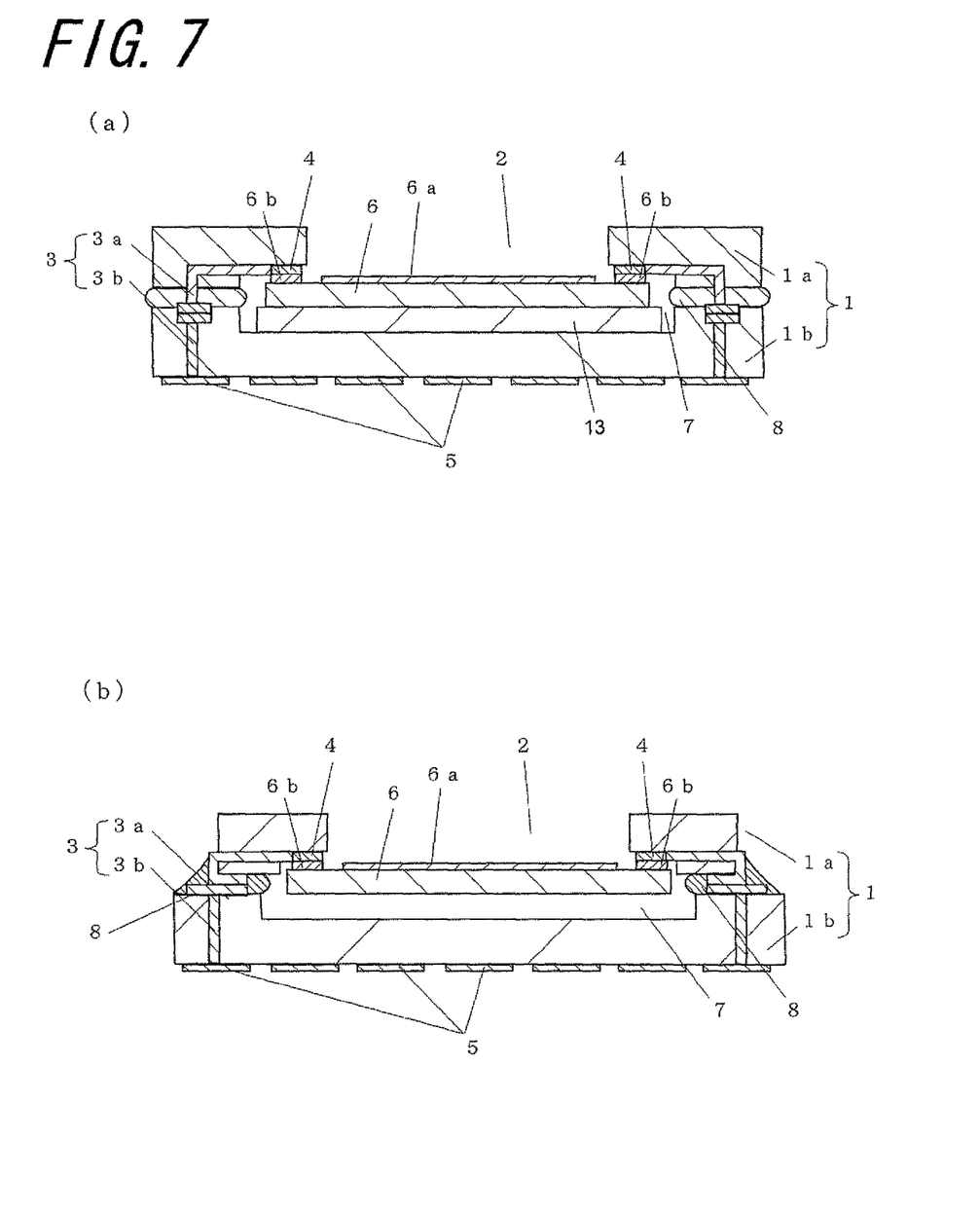
FIG. 7(a) and FIG. 7(b) are cross-sectional views showing other examples of embodiments of the imaging device of the invention.

In the example shown in FIG. 1, the recess portion 7 is formed in both the lower surface of the first insulating substrate 1a and the upper surface of the second insulating substrate 1b such that the through hole 2 is located on the inner side of the recess portion 7. As shown in the example in FIG. 3, a first recess portion 7a is formed in the lower surface of the first insulating substrate 1a such that the through hole 2 is located on the inner side thereof, and as shown in the example in FIG. 4, a second recess portion 7b is formed in the upper surface of the second insulating substrate 1b. Then, by joining together the first insulating substrate 1a and the second insulating substrate 1b, a recess portion 7 made of the first recess portion 7a and the second recess portion 7b is formed such that the through hole 2 is located to the inner side thereof, as shown in the example of FIG. 1.

Moreover, as shown in the example of FIG. 5(a), the first insulating substrate 1a may have a flat plate shape, and the second recess portion 7b may be formed on the upper surface of the second insulating substrate 1b, such that the through hole 2 is located to the inner side thereof. In this case, since the first insulating substrate 1a has a flat plate shape, as the first insulating substrate 1a in which the first recess portion 7a is formed as shown in the example of FIG. 1(b), when laminating a plurality of green sheets which turns to the first insulating substrate 1a and pressure-bonding them together, a portion which turns to the bottom surface of the first recess portion 7a will not warp due to applying a pressure of the same level to portions which turn to the lateral wall portions and the portion which turns to the bottom surface of the first recess portion 7a. Consequently, it is easy to ensure the flatness of the plurality of connection electrodes 4 to which the imaging element 6 is connected, so that an inclination of the imaging element 6 mounted on the first insulating substrate 1a with respect to the first insulating substrate 1a can be reduced, and external light can be entered more favorably. In this case, the imaging device can be used advantageously as an imaging device that is required to output an image signal with high image quality.

Moreover, in the example shown in FIG. 5(b), the second recess portion 7a is formed in the lower surface of the first insulating substrate 1a such that the through hole 2 is located to the inner side thereof, and the second insulating substrate 1b is formed in a flat-plate shape. In this case, even when the temperature of the usage environment changes and stress due to a thermal expansion difference between the external circuit board and the second insulating substrate 1b is applied to the second insulating substrate 1b, since the first recess portion 7a is formed in the first insulating substrate 1a, deformation tend to occur less than in the case where the first insulating substrate 1a has a flat-plate shape, which is effective in suppressing that the imaging element 6 mounted on the first insulating substrate 1a warps due to stress. In this case, the imaging device is robust against changes in the usage environment and can be used advantageously as an imaging device with excellent versatility.

Figure 8:
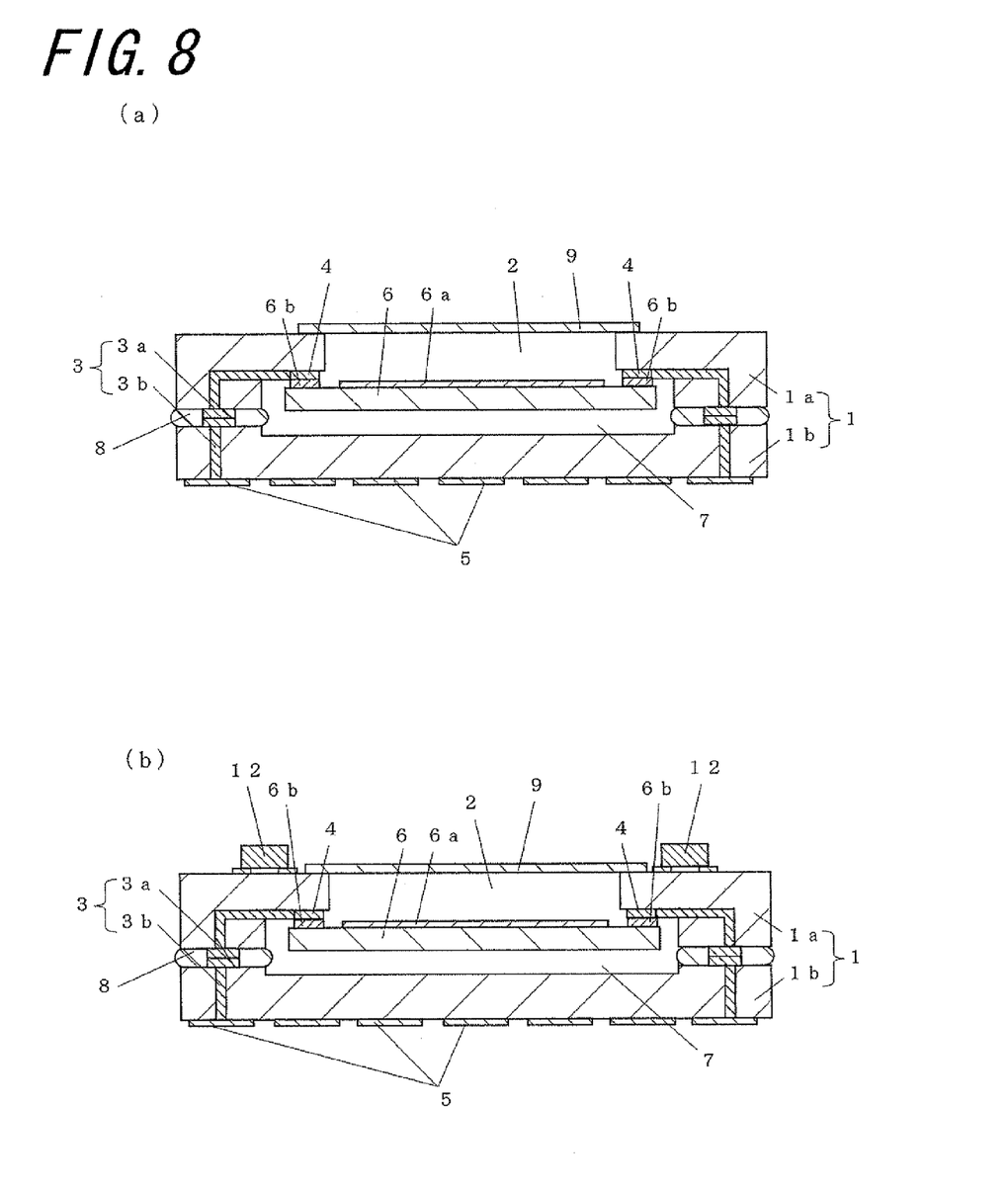
FIG. 8(a) and FIG. 8(b) are cross-sectional views showing other examples of embodiments of the imaging device of the invention.
Figure 9:
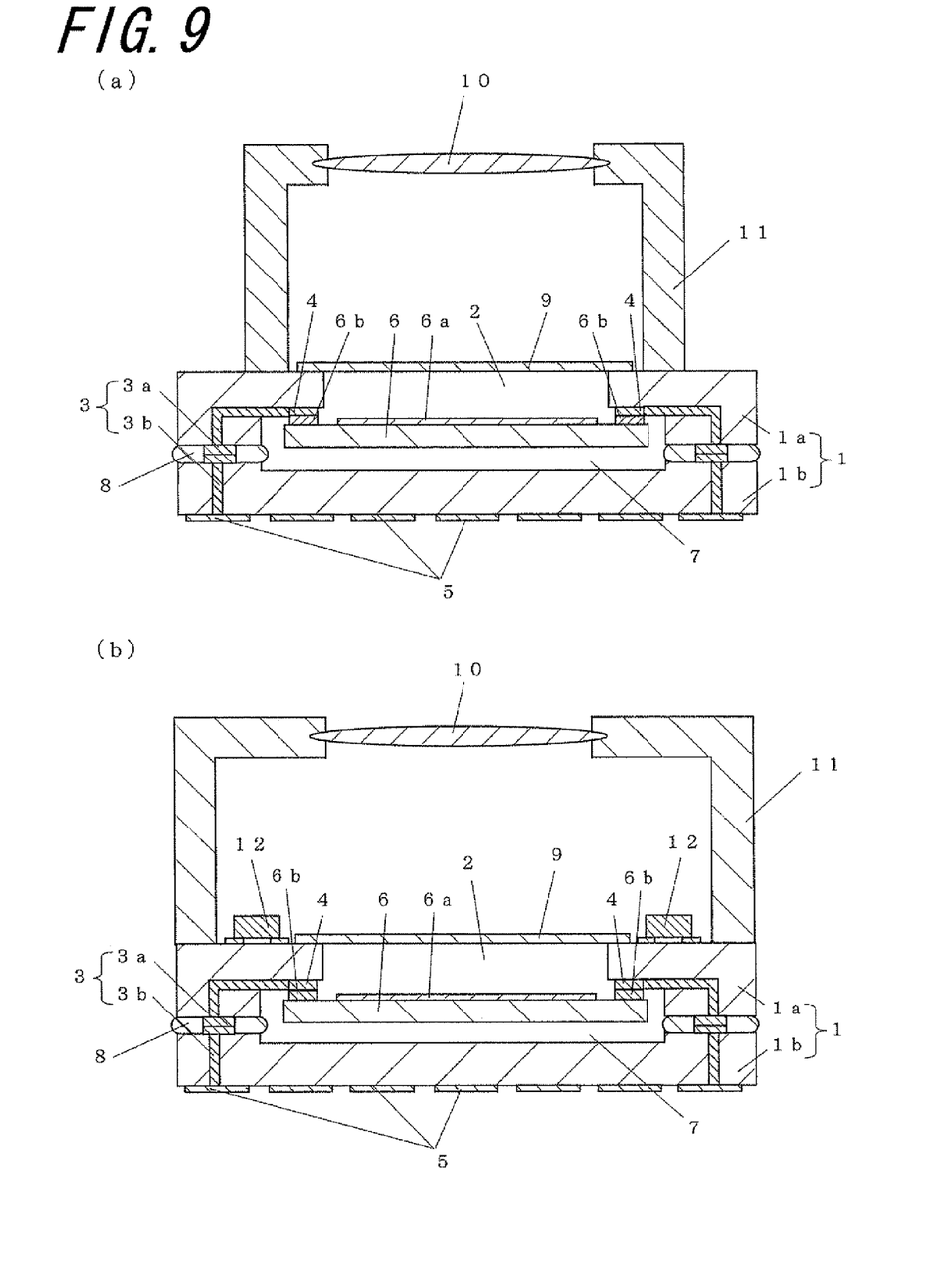
FIG. 9(a) and FIG. 9(b) are cross-sectional views showing examples of embodiments of an imaging device module of the invention.

As in the example shown in FIGS. 1(b), 5(b) and 8, in the case where the joint portion where the outer peripheral portion of the first insulating substrate 1a and the outer peripheral portion of the second insulating substrate 1b are joined together is arranged, in the thickness direction of the imaging device, on the second insulating substrate 1b side with respect to the light-receiving portion 6a, even when light enters the recess portion 7 from the joint portion, the light intrudes below the light-receiving portion 6a (on the second insulating substrate 1b side), so that unnecessary light reaching the light-receiving portion 6a can be reduced.

As in the example shown in FIG. 6(a), in the case where a depression 1c and a protrusion 1d formed at the outer peripheral portion of the first insulating substrate 1a and the outer peripheral portion of the second insulating substrate 1b are engaged with each other and joined together, with respect to the joint portion where the outer peripheral portion of the first insulating substrate 1a and the outer peripheral portion of the second insulating substrate 1b are joined together, it is possible to prevent light from intruding from the joint portion into the recess portion 7 due to the depression and the protrusion which engage with each other, so that unnecessary light reaching the light-receiving portion can be reduced. Furthermore, when the height of the protrusion 1d is made larger than the depth of the depression 1c of this depression-protrusion structure, and the first insulating substrate 1a and the second insulating substrate 1b are joined together using an anisotropic conductive film or an anisotropic conductive paste, a sufficient force is applied to the portion where the depression and the protrusion engage with each other, so that the electric connection between the first wiring conductor 3a and the second wiring conductor 3b can be made reliable.

Moreover, in the example shown in FIG. 6(a), the second wiring conductors 3b may be formed to extend from the bottom surface of the depression 1c along the inner peripheral surface of the depression 1c and near the opening of the depression 1c, and the first wiring conductors 3a may be formed to extend from the lower surface of the protrusion 1d along the lateral surface. Thus, the first wiring conductor 3a and the second wiring conductor 3b can be reliably connected electrically.

Moreover, the protrusion 1d may be provided with a stepwise shape so that its center portion becomes higher than the outer peripheral portion, and the depression 1c may be provided with a stepwise shape from its center portion to the outer peripheral portion so as to engage with the protrusion 1d. Thus, the joint surface between the depression 1c and the protrusion 1d is widened, which is effective in connecting the first insulating substrate 1a and the second insulating substrate 1b firmly together.

As in the example shown in FIG. 6(b), in the case where the joint portion where the outer peripheral portion of the first insulating substrate 1a and the outer peripheral portion of the second insulating substrate 1b are joined together is tilted towards the second insulating substrate 1b from the outer circumferential side of the first insulating substrate 1a and the outer circumferential side of the second insulating substrate 1b towards the center of the second insulating substrate 1b, even when light intrudes from the joint portion into the recess portion 7, unnecessary light reaching the light-receiving portion 6a can be reduced, since the light propagates towards the second insulating substrate 1b below the light-receiving portion 6a.

As in the example shown in FIG. 7(a), a projection portion 13 may be formed that is larger than the imaging element 6, when seen in a plan view, at the center portion on the upper surface of the second insulating substrate 1b so as to come into contact with the lower surface of the imaging element 6. In this case, heat generated by the imaging element 6 can be dissipated via the projection portion 13 to the second insulating substrate 1b. Moreover, by supporting the imaging element 6 with the projection portion 13, it is possible to suppress flexing of the imaging element 6. The upper surface of the projection portion 13 may come into contact with the lower surface of the imaging element 6, but when the joint portion between the lower surface of the imaging element 6 and the upper surface of the protrusion 13 is constituted by a joint member having a high thermal conductivity, such as a brazing material or a resin including a metal, heat can be dissipated easily from the imaging element 6 to the projection portion 13, which is effective in cases where the heat generated by the imaging element 6 is dissipated.

This projection portion 13 can be formed by making the center portion on the upper surface of the second insulating substrate 1b partially thicker than its outer peripheral portion. Alternatively, the projection portion 13 may also be formed by joining a member made of a material having a higher thermal conductivity than the second insulating substrate 1b, for example a metal material such as copper (Cu), copper-tungsten (Cu—W) or aluminium (Al), with a joining member having a high thermal conductivity, such as a brazing material made of a silver-copper alloy or the like or a resin including a silver-copper alloy, to the upper surface of the second insulating substrate 1b.

Even when no projection portion 13 is provided, when manufacturing in such a manner that the lower surface of the imaging element 6 and the upper surface of the second insulating substrate 1b come into contact with each other, the heat generated by the imaging element 6 can be dissipated towards the second insulating substrate 1b, and flexing of the imaging element 6 can be suppressed, which is preferable. Also in this case, it is preferable that the lower surface of the imaging element 6 and the upper surface of the second insulating substrate 1b are joined together with a joining member having high thermal conductivity, as mentioned above.

As in the example shown in FIG. 7(b), in the case where the sizes of the first insulating substrate 1a and the second insulating substrate 1b differ in a plan view, and the outer peripheral portion of the larger insulating substrate of the first insulating substrate 1a and the second insulating substrate 1b and the outer peripheral portion and the lateral surface of the smaller insulating substrate are joined together with a joining member 8, in addition to the outer peripheral portion, they are joined together at the lateral surface of the smaller insulating substrate and at the outer peripheral portion of the larger insulating substrate, so that the strength with which the first insulating substrate 1a and the second insulating substrate 1b are joined together can be increased.

Moreover, in the case of the example shown in FIG. 7(b), for the joining member 8, a material that can be stuck to the lateral surface of the first insulating substrate 1a, for example a material having high viscosity, such as anisotropically conductive paste, is used. Moreover, when a material with high wettability with respect to the insulating substrates 1 is used for the joining member 8, a so-called fillet is formed between the lateral surface of the first insulating substrate 1a and the outer peripheral portion of the upper surface of the second insulating substrate 1b, which is effective in increasing the joint strength. Moreover, in the case where the first insulating substrate 1a is smaller than the second insulating substrate 1b when seen in a plan view, the strength of the joint portion between the first insulating substrate 1a and the second insulating substrate 1b can be increased without reducing the surface area of the joint portion between the outside terminals 5 and the wiring conductors of the external circuit board, which is effective.

The imaging device can be manufactured as described below. First, a first insulating substrate 1a and a second insulating substrate 1b as described above are prepared.

Insulating substrates for the first insulating substrate 1a and the second insulating substrate 1b are made of an insulator such as ceramics or resin. In the case of being made of ceramics, examples thereof include sintered aluminum oxide (alumina ceramics), sintered aluminum nitride, sintered mullite, and sintered glass ceramics, and in the case of being made of a resin, examples thereof include epoxy resin, polyimide resin, acrylic resin, phenolic resin, polyester resin and fluorine-based resin such as tetrafluoroethylene resin. Other examples are substrates made of glass fiber impregnated with a resin such as glass epoxy resin.

In the case where the insulating substrates are made of sintered aluminum oxide, for example, they can be made by adding and mixing a suitable organic solvent and a solvent to a raw material powder of alumina ($Al_2O_3$), silica ($SiO_2$), calcium oxide (CaO) and magnesia (MgO) or the like to obtain a slurry, shaping the slurry into a sheet by using a conventionally known method such as a doctor blade method or a calender roll method to obtain a ceramic green sheet, then subjecting the ceramic green sheet to a suitable punching process and laminating a plurality of ceramic green sheets as necessary, and firing it at a high temperature (about 1500 to 1800° C.). The through hole 2 and the recesses 7 (first recess 7a and second recess 7b) in the insulating substrates can be formed by forming through holes for the through hole 2 and the recesses 7 in some of the ceramic green sheets for the insulating substrates by punching with a die or a punch, or by laser processing. Moreover, as in the example shown in FIG. 3(b), in the case where the first recess 7a is formed in the first insulating substrate 1a, it is possible to form the first recess 7a by forming the through hole for the first recess 7a in the ceramic green sheets larger than the through hole for the through hole 2 and laminating these ceramic green sheets.

In the case where the insulating substrates for the first, insulating substrate 1a and the second insulating substrate 1b are made, for example, of resin, they can be formed by shaping them by transfer molding or injection molding, using a die that can shape the insulating substrates into a predetermined shape. Moreover, they may be made of a material in which a base material made of glass fiber is impregnated with a resin such as glass epoxy resin, and in this case, it is possible to form them by impregnating a base material made of glass fiber with a precursor of epoxy resin and thermally curing this expoxy resin precursor at a predetermined temperature.

In the case where the insulating substrates are made of ceramics, the wiring conductors 3 (first wiring conductor 3a and second wiring conductor 3b), the connection electrodes 4 and the outside terminals 5 are made of a metallic powder metallization of tungsten (W), molybdenum (Mo), manganese (Mn), silver (Ag), copper (Cu) or the like, and can be formed at predetermined locations on the insulating substrate by printing a conductive paste for the wiring conductors 3 in a predetermined shape on the ceramic green sheets for the insulating substrates by screen printing or the like, and firing it at the same time as the ceramic green sheets for the insulating substrates. Among internal conductors, through-conductors penetrating the ceramic green sheets in its thickness direction can be formed by filling through holes formed in the ceramic green sheets by printing a conductive paste thereon. Such a conductive paste can be fabricated and adjusted to the right viscosity by adding a suitable solvent and a binder to the above-noted metallic powder and kneading. It should be noted that in order to increase the strength of the joint with the insulating substrates, glass or ceramics may be included.

In the case where the insulating substrates are made of resin, the wiring conductors 3, the connection electrodes 4 and the outside terminals 5 are made of a metal material such as copper, gold, aluminum, nickel, chrome, molybdenum, titanium or an alloy thereof. For example, they can be formed by transferring a foil processed into the shape of the wiring conductors 3, the connection electrodes 4 and the outside terminals 5 onto resin sheets made of glass epoxy resin, laminating the resin sheets onto which the foil has been transferred and gluing them together with an adhesive. Among internal conductors, through-conductors penetrating the resin sheet in its thickness direction may be formed by printing a conductive paste or by adhering through plating to the inner walls of through holes formed in the resin sheet, or by filling the through holes. Moreover, they may also be formed by integrating metal foils and metal columns into one by resin shaping, or by deposition on an insulating substrate using sputtering, vapor deposition, plating or the like.

A plating layer is deposited by electrolytic plating or non-electrolytic plating on the surfaces where the wiring conductors 3, the connection electrodes 4 and the outside terminals 5 are exposed. The plating layer is made of a metal with excellent corrosion resistance and excellent connectivity to the connection terminals 6b, such as nickel and gold, and is made by successively depositing a nickel plating layer with a thickness of about 1 to 10 μm and a gold plating layer with a thickness of about 0.1 to 3 μm. Thus, corrosion of the wiring conductors 3, the connection electrodes 4 and the outside terminals 5 can be effectively suppressed, and the joint portions between the first wiring conductors 3a and the second wiring conductors 3b, the joint portions between the connection terminals 6b of the imaging element 6 and the connection electrodes 4, the joint portions between the wiring conductors 3 and the electronic components 12, as well as the connection between the outside terminals 5 and the wiring conductors of the external circuit board can be strengthened.

Next, the CCD-type or CMOS-type imaging element 6 is flip-chip bonded by arranging it below the first insulating substrate 1a so that the light-receiving portion 6a is located within the through hole 2, and bonding it with solder, ultrasonic bonding with Au bumps or adhering it with a resin with anisotropic conductivity such that the connection terminals 6b and the connection electrodes 4 are electrically connected. It should be noted that in the case where flip-chip bonding with solder or Au bumps is performed, it is preferable to fill an underfiller material (not shown) into the through hole 2, in order to reinforce the joint portion between the connection terminals 6b of the imaging element 6 and the connection electrodes 4 and protect the light-receiving portion 6a by sealing the inner side of the through hole 2.

Next, the first insulating substrate 1a and the second insulating substrate 1b are joined together with the joining member 8 while electrically connecting the first wiring conductors 3a and the second wiring conductors 3b that are exposed at the respective outer peripheral portions. For example, the first wiring conductors 3a and the second wiring conductors 3b are electrically connected by a joint material having conductivity such as solder, and a joint material such as epoxy-based resin is applied therearound, thereby reinforcing the joint portion between the first insulating substrate 1a and the second insulating substrate 1b and sealing the space between the first insulating substrate 1a and the second insulating substrate 1b. Alternatively, using an anisotropic conductive film (ACF) or an anisotropic conductive paste (ACP), the joint portion between the first insulating substrate 1a and the second insulating substrate 1b and the electrical connection between the first wiring conductors 3a and the second wiring conductors 3b may be simultaneously performed.

Moreover, in the case where the first insulating substrate 1a and the second insulating substrate 1b are made of materials with the same thermal expansion coefficient, even when the ambient temperature changes due to changes in the usage environment or the like, it is possible to suppress thermal stress that is applied due to a difference in thermal expansion at the joint portions between the first wiring conductors 3a of the first insulating substrate 1a and the second wiring conductors 3b of the second insulating substrate 1b, so that it is possible to reduce the possibility of ruptures at the joint portions between the first wiring conductors 3a and the second wiring conductors 3b.

In order to make the first insulating substrate 1a and the second insulating substrate 1b of materials with the same thermal expansion coefficient, in the case where the first insulating substrate 1a and the second insulating substrate 1b are, for example, made of ceramics, it is possible to provide the first insulating substrate 1a and the second insulating substrate 1b with the same thermal expansion coefficient by fabricating them using ceramic greens sheet to which similar raw material powders have been admixed. For example, in the case where the first insulating substrate 1a is of alumina ceramics (thermal expansion coefficient: about $7 \times 10^{-6}/°$ C.), alumina ceramics should also be used for the second insulating substrate 1b.

Moreover, when forming the depression 1c and the protrusion 1d as in the example shown in FIG. 6(a), in the case where the first insulating substrate 1a and the second insulating substrate 1b are made of ceramics, the depression 1c and the protrusion 1d can be formed on the lower surface of the first insulating substrate 1a and the upper surface of the second insulating substrate 2a by processing a plurality of green sheets into suitable dimensions by punching with a die or a punch or by laser processing, and laminating them. Moreover, the depression 1c and the protrusion 1d may be formed with a ceramic paste using the same material as that of the ceramic green sheets, and the protrusion 1d may be formed with one of the wiring conductors 3. Moreover, in the case where the first insulating substrate 1a and the second insulating substrate 1b are made of resin, they can be shaped to the desired shape using a suitable die.

Moreover, in the case where the first insulating substrate 1a and the second insulating substrate 1b are made of ceramics, an inclined surface formed such that the outer periphery side of the first insulating substrate 1a and the outer periphery side of the second insulating substrate 1b inclines towards the second insulating substrate, as in the example shown in FIG. 6(b), can be formed by applying multiple times a paste made of the same material as the first insulating substrate 1a and the second insulating substrate 1b. It is also possible to form the inclined surface by pressing a die onto the ceramic green sheets. Moreover, in the case where the first insulating substrate 1a and the second insulating substrate 1b are made of resin, they may be formed using a suitable die with which the desired shape is obtained.

Moreover, as in the example shown in FIG. 8(a) and FIG. 8(b), in the above-described imaging device, it is preferable that a light-transmitting plate member 9 is attached to the upper surface of the first insulating substrate 1a and covers the through hole 2. With such a configuration, moisture or dust will not enter the through hole 2 and adhere to the light-receiving portion 6a of the imaging element 6, so that it is possible to protect the imaging element 6 and it is possible to output an image signal of high image quality without compromising the light reception. For example, it is possible to prevent that debris generated when the fixing member 11 to which the lens 10 is fixed is joined to the upper surface of the first insulating substrate 1a enters the through hole 2 and adheres to the light-receiving portion 6a of the imaging element 6.

Moreover, in the case where the space enclosing the imaging element 6 and the light-transmitting plate member 9 as well as the first insulating substrate 1a is sealed, the light-transmitting plate member 9 may be joined to the first insulating substrate 1a by a ring-shaped joining member made of resin or the like which is placed between the outer peripheral portion of the light-transmitting plate member 9 and the upper surface of the first insulating substrate 1a. With such a configuration, moisture and dust can be kept from intruding into the sealed space, and corrosion of the imaging element due to high humidity can be suppressed.

Moreover, as in the example shown in FIG. 8(b), electronic components 12 other than the imaging element 6 may be mounted on the imaging device as necessary. The electronic components 12 may be ICs for processing electric signals, capacitors, coils, resistors or the like, and may be mounted for example by connecting them to the first wiring conductors 3a with a conductive joining material such as solder. The electronic components 12 may be mounted to the first insulating substrate 1a after joining the first insulating substrate 1a and the second insulating substrate 1b together, but they may also be mounted to the first insulating substrate 1a before this joining. As in the example shown in FIG. 8(b), in the case where the electronic components 12 are mounted at locations where they overlap the recess portion 7 when seen in a plan view, since the insulating substrate around the through hole 2 is thin and there is a void below it due to the recess portion 7, it may occur that cracks are caused around the through hole 2 in the first insulating substrate due to the impact when mounting the electronic components 12, and the connection terminals 6b of the imaging element 6 and the connection electrodes 4 peel off, so that it is preferable that the electronic components 12 are mounted to the first insulating substrate 1a and the imaging element 6 is mounted to the first insulating substrate 1a, followed by joining the first insulating substrate 1a and the second insulating substrate 1b together. Even in the case where the electronic components 12 are mounted to the first insulating substrate 1a, when the electronic components 12 are mounted to an imaging device in which the recess portion 7 is formed in the first insulating substrate 1a, as in the example shown in FIG. 1(b) and FIG. 5(b), it is preferable to place the first insulating substrate 1a on a supporting plate provided with a protruding portion whose shape corresponds to the shape of the through hole 2 in the first insulating substrate 1a, in order to reduce the possibility of similar damage.

As in the example shown in FIG. 8(b), in the case where the first insulating substrate 1a and the second insulating substrate 1b are joined together, followed by mounting the electronic components 12 by soldering, when the electronic components 12 are mounted after attaching the light-transmitting plate member 9, it is possible to prevent flux or solder particles included in solder cream from being scattered, entering the through hole 2 and attaching to the light-receiving portion 6a of the imaging element 6.

The light-transmitting plate member 9 is made of quartz or glass or a resin such as epoxy resin, and is joined to the first insulating substrate 1a with an adhesive such as thermally curing or UV-curing epoxy resin or glass. For example, an adhesive made of UV-curing epoxy resin is applied by dispensing it around the through hole 2 on the upper surface of the first insulating substrate 1a or onto the outer edge of the light-transmitting plate member 9, and placing the light-transmitting plate member 9 on the first insulating substrate 1a and irradiating with UV light, thereby curing the adhesive and sealing it. A filter may be formed on the light-transmitting plate member 9. This is preferable because the thickness of the imaging device can be made smaller than in the case where a separately manufactured filter is arranged on the light-transmitting plate member 9.

An example of such a filter is a low-pass filter in which two or three quartz plates with different crystal orientation angles are laminated upon each other, thus preventing the moiré effect in video images taken by the imaging element 6, utilizing the birefringence of the quartz plates. In the case where quartz plates are used as the light-transmitting plate member 9, the light-transmitting plate member 9 can also serve as one such quartz plate of this low-pass filter.

Moreover, in order to adapt the imaging element 6, which ordinarily has the tendency of having a higher sensitivity than the human visual sense from red colors to the infrared region, to the color sensitivity of the human eye, there is also an IR cutting filter that cuts light of a wavelength from red colors to the infrared region. The IR cutting filter can be manufactured by forming a dielectric multilayer of several dozen layers alternately on the surface of the light-transmitting plate member 9. The dielectric multilayer is formed by alternately vapor depositing or sputtering several dozen layers of a high-refractive index dielectric layer made of a dielectric material with a refractive index of 1.7 or more and a low-refractive index dielectric layer made of a dielectric material with a refractive index of 1.6 or less. As a dielectric material with a refractive index of 1.7 or more, tantalum pentoxide, titanium oxide, niobium pentoxide, lanthanum oxide, zirconium oxide or the like may be used, and as a dielectric material with a refractive index of 1.6 or less, silicon oxide, aluminum oxide, lanthanum fluoride, magnesium fluoride or the like may be used, for example.

Moreover, as in the example shown in FIGS. 9(a) and FIG. 9(b), in an imaging device module of the invention, a lens 10 is arranged over the through hole 2 in the first insulating substrate 1a of the imaging device of the invention with any of the above-described configurations. With this configuration, an imaging device module is achieved that is compact and thin, and with which an image signal of high image quality can be outputted. The lens 10 is made of glass or a resin such as epoxy resin, and is attached to a lens-fixing member 11. Light that has passed through an opening in the lens-fixing member 11 and through the lens 10 can enter the light-receiving portion 6a. As in the example shown in FIG. 9(a) and FIG. 9(b), the lens-fixing member 11 is made of resin or metal or the like, and is fixed to the upper surface of the first insulating substrate 1a with an adhesive of epoxy resin, solder or the like. Alternatively, it is fixed to the first insulating substrate 1a with hooks with which the lens-fixing member 11 is provided in advance.

It should be noted that the invention is not limited to the examples of the above-described embodiments, and various modifications are possible without departing from the gist of the invention.

For example, the imaging device may be configured that the lateral wall portions are formed at locations that oppose each other in vertical or horizontal direction when seen in a plan view, and the imaging element 6 is accommodated in an open recess portion 7. Thus, when joining the first insulating substrate 1a and the second insulating substrate 1b together, it is possible to join them together while emitting heat or gas generated inside the recess portion 7 to the outside, so that it is effective in suppressing deformations caused when joining the first insulating substrate 1a and the second insulating substrate 1b together.

Moreover, it is preferable that in the portion where the first insulating substrate 1a and the second insulating substrate 1b are joined together, the depression and the protrusion are formed in at least on one of the first insulating substrate 1a and the second insulating substrate 1b. Thus, the joint is strengthened by increasing the surface area of the joint, and when the depression and the protrusion that can be fitted into each other are provided, it is easy to position the first insulating substrate 1a and the second insulating substrate 1b. Moreover, in the case where the first wiring conductors 3a of the first insulating substrate 1a and the second wiring conductors 3b of the second insulating substrate 1b are bonded by soldering, it is possible to prevent flux or solder particles included in solder cream from being scattered and attaching to the light-receiving portion 6a of the imaging element 6. Also in the case of joining with a conductive resin, it is possible to prevent the wiring conductors 3 within the recess portion 7 from being short-circuited by flowing of the conductive resin into the recess portion 7.

REFERENCE SIGNS LIST

1: Wiring substrate
1a: First insulating substrate
1b: Second insulating substrate
1c: Depression
1d: Protrusion
2: Through hole
3: Wiring conductor
3a: First wiring conductor
3b: Second wiring conductor
4: Connection electrode
5: Outside terminal
6: Imaging element
6a: Light-receiving portion
6b: Connection terminal
7: Recess portion
7a: First recess portion
7b: Second recess portion
8: Joint member
9: Light-transmitting plate member
10: Lens
11: Lens-fixing member
12: Electronic component
13: Projection portion

The invention claimed is:
1. A wiring substrate, comprising:
a first insulating substrate comprising
   a through hole formed in a center portion thereof,
   a connection electrode to which a connection terminal of an imaging element is connected, being arranged around the through hole on a lower surface of the first insulating substrate, and
   a first wiring conductor comprising one end connected to the connection electrode and the other end led out to an outer peripheral portion on the lower surface of the first insulating substrate; and
a second insulating substrate comprising
   a plurality of outside terminals arranged on a lower surface of the second insulating substrate, and
   a second wiring conductor comprising one end connected to the outside terminals and the other end led out to an outer peripheral portion on an upper surface of the second insulating substrate, wherein
at least one of the lower surface of the first insulating substrate and the upper surface of the second insulating substrate comprises a recess portion, the through hole being located on an inner side of the recess portion in a plan view, and an outer peripheral portion of the first insulating substrate being joined to an outer peripheral portion of the second insulating substrate so that the first wiring conductor and the second wiring conductor are electrically connected to each other, wherein a size of the first insulating substrate and a size of the second insulating substrate are different in a plan view, and wherein the first insulating substrate and the second insulating substrate are joined together with a joining member, the joining member being arranged at an outer peripheral portion of the larger insulating substrate and an outer peripheral portion and a lateral surface of the smaller insulating substrate.

2. An imaging device, comprising:

a first insulating substrate comprising
- a through hole formed in a center portion thereof,
- a connection electrode arranged around the through hole on a lower surface of the first insulating substrate, and
- a first wiring conductor comprising one end connected to the connection electrode and the other end led out to an outer peripheral portion on the lower surface of the first insulating substrate;

a second insulating substrate comprising
- a plurality of outside terminals arranged on a lower surface of the second insulating substrate, and
- a second wiring conductor comprising one end connected to the outside terminals and the other end led out to an outer peripheral portion on an upper surface of the second insulating substrate; and an imaging element comprising
- a light-receiving portion arranged at a center portion on an upper surface thereof, and
- a connection terminal arranged at an outer peripheral portion thereof, wherein at least one of the lower surface of the first insulating substrate and the upper surface of the second insulating substrate comprises a recess portion, the through hole being located on an inner side thereof, the imaging element is arranged below the first insulating substrate such that the light-receiving portion on the upper surface of the imaging element is located within the through hole in a plan view, the connection terminal being electrically connected to the connection electrode, and an outer peripheral portion of the first insulating substrate being joined to an outer peripheral portion of the second insulating substrate so that the first wiring conductor and the second wiring conductor are electrically connected to each other and the imaging element is accommodated inside the recess portion, wherein the outer peripheral portion of the first insulating substrate and the outer peripheral portion of the second insulating substrate are joined together at a joint portion, and wherein, in a thickness direction of the imaging device, a distance between the joint portion and the lower surface of the second insulating substrate is smaller than a distance between the light receiving-portion of imaging element and the lower surface of the second insulating substrate.

3. The imaging device according to claim 2, wherein the first insulating substrate and the second insulating substrate are made of materials with a same thermal expansion coefficient.

4. The imaging device according to claim 2, wherein the outer peripheral portion of the first insulating substrate and the outer peripheral portion of the second insulating substrate are joined together by engaging together a depression and a protrusion that are formed at the outer peripheral portion of the first insulating substrate and the outer peripheral portion of the second insulating substrate.

5. The imaging device according to claim 2, wherein the joint portion is joined to the outer peripheral portion of the second insulating substrate is inclined from an outer periphery side of the first insulating substrate and an outer periphery side of the second insulating substrate toward a center of the second insulating substrate to the second insulating substrate side.

6. The imaging device according to claim 2, wherein a size of the first insulating substrate and a size of the second insulating substrate are different in a plan view, and the first insulating substrate and the second insulating substrate are joined together with a joining member, the joining member being arranged at an outer peripheral portion of the larger insulating substrate and an outer peripheral portion and a lateral surface of the smaller insulating substrate.

7. The imaging device according to claim 2, wherein a light-transmitting plate member is attached to the upper surface of the first insulating substrate and covers the through hole.

8. The imaging device according to claim 7, wherein a space enclosed by the imaging element, the light-transmitting plate member and the first insulating substrate is sealed.

9. An imaging device module, comprising:

the imaging device according to claim 2; and a lens arranged over the through hole on the upper surface of the first insulating substrate.

* * * * *